United States Patent
Ma et al.

(10) Patent No.: US 6,496,424 B2
(45) Date of Patent: Dec. 17, 2002

(54) METHOD AND APPARATUS FOR GENERATING AND CONTROLLING INTEGRATED CIRCUIT MEMORY WRITE SIGNALS

(75) Inventors: James H. Ma, San Jose; Mark T. Kawahigashi, Fremont, both of CA (US)

(73) Assignees: Sun Microsystems, Santa Clara, CA (US); LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/839,441

(22) Filed: Apr. 20, 2001

(65) Prior Publication Data

US 2002/0154550 A1 Oct. 24, 2002

(51) Int. Cl.[7] .................................................. G11C 7/00
(52) U.S. Cl. .................... 365/191; 365/189.01; 365/194
(58) Field of Search ................................ 365/191, 233, 365/205, 189.01, 194, 230.06

(56) References Cited

U.S. PATENT DOCUMENTS

| 4,767,947 | A | | 8/1988 | Shah |
| 4,970,687 | A | | 11/1990 | Usami et al. |
| 5,535,343 | A | * | 7/1996 | Verseput ...................... 365/308 |
| 5,546,355 | A | * | 8/1996 | Raatz et al. ................. 365/233 |
| 5,715,201 | A | * | 2/1998 | Khieu .......................... 365/191 |
| 5,767,715 | A | | 6/1998 | Marquiz et al. |
| 5,835,449 | A | * | 11/1998 | Lee ........................... 365/238.5 |
| 5,889,728 | A | | 3/1999 | Rezeanu |

* cited by examiner

*Primary Examiner*—Hoai Ho
*Assistant Examiner*—Thong Le
(74) *Attorney, Agent, or Firm*—Bernice Chen

(57) ABSTRACT

A circuit and method for generating a write enable pulse that is independent of the clock duty cycle and the clock frequency. The circuit includes a pulse generator for generating a pulse in response to a clock signal and a write enable signal generator for generating a write enable pulse. The pulse tracks the leading edge of the clock signal. A logic circuit is coupled to the pulse generator and the write enable signal generator to generate the write enable pulse by combining the pulse and the write enable signal.

20 Claims, 3 Drawing Sheets

METHOD AND APPARATUS FOR GENERATING AND CONTROLLING INTEGRATED CIRCUIT MEMORY WRITE SIGNALS

FIELD OF THE INVENTION

This invention relates to generation and control of write enable signals for memory devices, in particular, to an apparatus and method of controlling the width of the write enable pulse and the relative position of the write enable pulse with respect to a clock signal, without dependency on the clock duty cycle and frequency.

BACKGROUND OF THE INVENTION

Local or temporary storage of information is often needed for application specific integrated circuits (ASICs). ASICs provide their users the ability to manufacture products having a proprietary design without having to begin the design at the device level. Many different ASIC technologies are available, including gate array, standard cell, full custom design, and programmable logic devices.

ASICs generally require internal storage facilities that typically take the format of first-in-first-outs (FIFOs) or register files. However, the library of logic elements available for use with a particular manufacturer's ASIC devices seldom include pre-constructed FIFOs or register files because FIFOs and register files come in many variations. Thus, it is very difficult for ASIC manufacturers to provide compatibility for all variations of the pre-constructed FIFOs or register files. The ASIC library, therefore, often contains random access memories (RAMs) of various sizes which are used by ASIC designers to construct FIFOs and register files that suit a particular application.

The RAMs provided in the ASIC library may be static or dynamic and may be synchronous or asynchronous. Certain RAM devices require precise control of the write enable pulse during programming, particularly for high speed applications. However, all RAM elements are sensitive to the timing relationships between the write enable pulse and the address and data signals. A write enable pulse is generated in order to establish a window for the write cycle to occur and must have a pulse width that ensures a predetermined setup time and hold time for the write enable signal, address signals, and input write data signal. If the write enable pulse is not precisely controlled during the write cycle, incorrect data may be written into the selected memory cell. Typically, the write enable pulse is dependent on the frequency and the duty cycle of the system clock signal, the rising edge of the system clock signal initiating the pulse and the duty cycle of the system clock signal determining the duration of the write enable pulse.

Synchronous devices, sometimes referred to as "registered" RAMs in which the input data and control signals and/or output data signals are registered or latched in the RAM element, are typically preferred for general applications because such RAM devices are easy to design with. Synchronous RAMs use the clock input to latch the write enable, address, and data signals and an internal timing circuit that generates and times an internal write enable pulse to ensure that all setup and hold requirements are met. Since synchronous RAMs internally generate the write enable pulses, when an ASIC designer chooses to use synchronous RAM for internal storage, the design of the precise write enable pulses and the handling of the complex interdependencies between the write enable, address and data signals are performed by the ASIC manufacturer. To this end, the ASIC designer only needs to ensure that the write enable, address and data signals external to the synchronous RAM element meet the setup and hold times with respect to the clock signal.

Alternatively, asynchronous RAMs provide better performance than synchronous RAMS for designs that require the shortest possible latency because synchronous RAMs impose one additional clock cycle of delay if input signals are registered and two additional clock cycles of delay if output data signals are also registered while asynchronous RAMs do not impose such latencies. Unlike the synchronous RAM situation described above where the ASIC designer only needs to ensure setup and hold time requirements of the write enable, address, and data signals external to the RAM element with respect to the clock signal are met, the ASIC designer must control the write enable pulse so that the setup and hold time requirements with respect to the address and input data signals are met over all process, voltage, and temperature variations. In addition to write enable pulse width requirements, both synchronous and asynchronous RAM elements impose possible system requirements for testing these internal RAMs.

Efforts have been made to better control the write enable pulse generation. For example, U.S. Pat. No. 5,535,343 entitled "Method and Apparatus for Generating Write Signals" describes a method of generating write pulses using two toggle flip-flops with one flip-flop clocked off of the rising edge of the clock and the other flip-flop clocked off of the falling edge of the clock. The output of these two flip-flops are then exclusive NORed together to generate the active low write pulse. This technique has several shortcomings. First, the width of the write pulse is determined by the falling edge of the clock signal which can have considerable variation, thus producing write pulses having different widths. Second, there is no mechanism for adjusting the position of the leading edge of the write pulse with respect to the clock signal, nor is there a mechanism for adjusting the width of the write pulse.

Another example of write enable pulse generation is described in U.S. Pat. No. 5,546,355 entitled "Integrated Circuit Memory Having A Self-Timed Write Pulse Independent of Clock Frequency And Duty Cycle" which shows the generation of write pulses using two delay lines and combinatorial feedback loops. However, combinatorial feedback loops are generally not supported by current integrated circuit (IC) design tools such as place and route, design rule checking, static timing analysis, simulation, and test vector generation.

SUMMARY OF THE INVENTION

In accordance with the present invention, a write enable pulse is generated such that it is independent of the clock duty cycle and the clock frequency. A pulse generator for generating a pulse in response to a clock signal and a write enable signal generator for generating a write enable signal are coupled to a logic circuit. The pulse tracks the leading edge of the clock signal and is independent from the trailing edge of the clock signal. The logic circuit generates the write enable pulse by combining the pulse and the write enable signal. By generating the pulse and the write enable signal independently from each other and combining at the final stage of the circuit allows maximum flexibility and tightest control of the write enable pulse.

The pulse generator may include a device for generating an output signal in response to a clock signal. The device decouples the output signal from the trailing edge of the clock signal. The pulse generator includes a first delay circuit coupled to the device and a second delay circuit coupled to the first delay circuit. The delay circuits are polarity independent and allow independent control of the rising edge and the falling edge of the pulse. A second logic circuit is coupled to the first delay circuit and the second delay circuit, the second logic circuit generating the pulse by combining the first delay signal and the second delay signal.

The write enable signal generator may include a selector for selecting a registered external write enable signal from a plurality of registered external write enable signals. The selector allows the use of multiple external write enable signals without significantly impacting the performance of the circuit because the selector eliminates the need for multiple pulse generators (e.g., one for each external write enable signal).

This summary is not intended to limit the scope of the invention, which is defined solely by the claims attached hereto.

BRIEF DESCRIPTIONS OF THE DRAWINGS

While specific embodiments are described and illustrated herein, these embodiments are not intended to limit the scope of the invention, which is susceptible to various modifications and alternative forms.

DETAILED DESCRIPTION OF THE INVENTION

Figure 1:
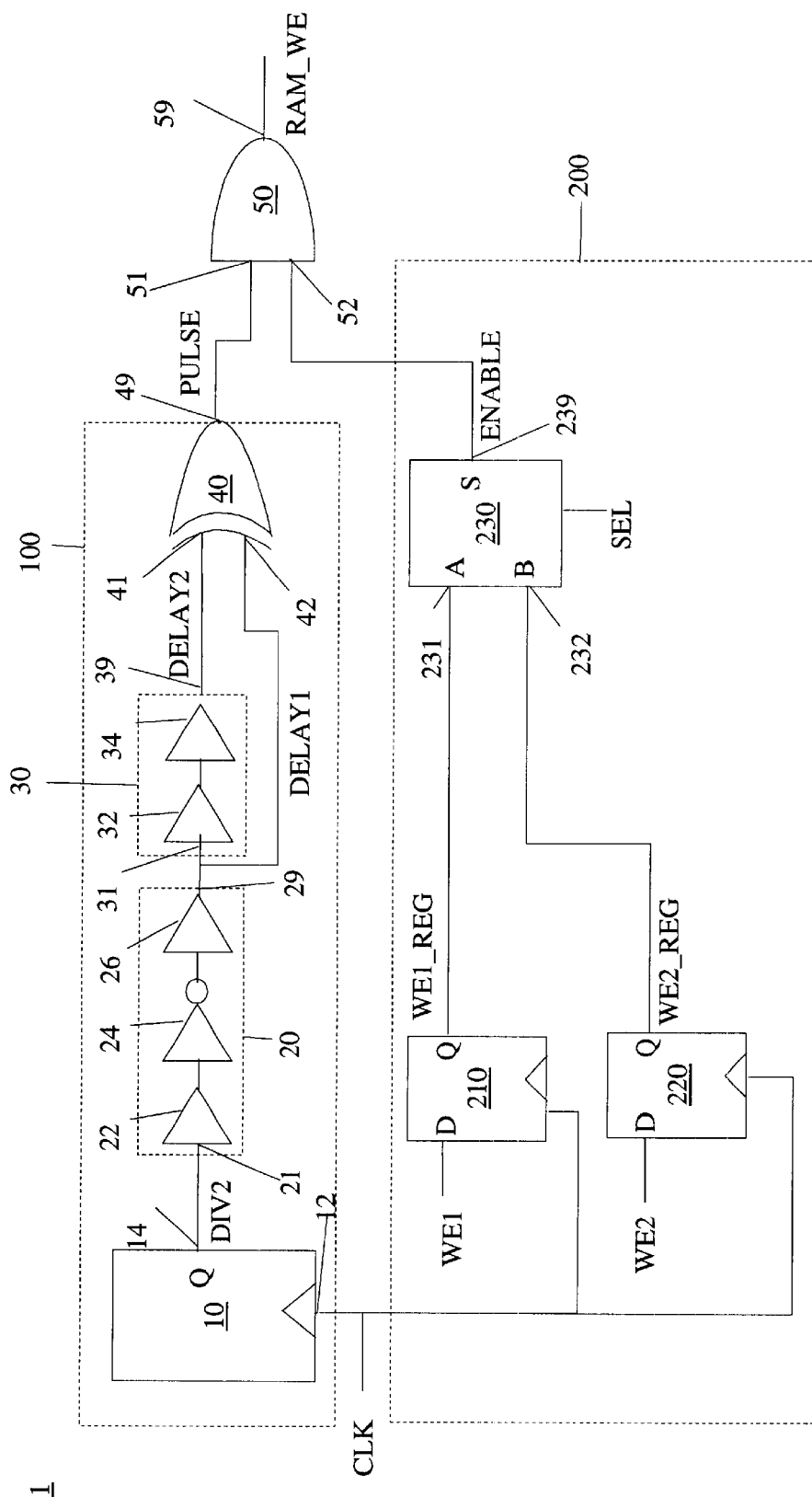
FIG. 1 shows a circuit for generating and controlling a memory write enable pulse in accordance with the present invention

Method and apparatus for generating and controlling write enable pulses that are independent from the duty cycle and the frequency of the clock signal are provided. FIG. 1 illustrates a circuit for generating and controlling a memory write enable pulse in accordance with the present invention. Circuit 1 includes a pulse generator 100 for generating a pulse signal PULSE in response to a clock signal CLK, a write enable signal generator 200 for generating a write enable signal ENABLE from a plurality of external write enable signals (e.g., external write enable signals WE1 and WE2), and a logic circuit 50 coupled to pulse generator 100 and write enable signal generator 200 for generating a RAM write enable pulse RAM_WE by combining pulse signal PULSE and write enable signal ENABLE. Because pulse signal PULSE and write enable signal ENABLE are generated independently from each other, no critical or precise timing between these signals is required. In addition, logic circuit 50 combines pulse signal PULSE and write enable signal ENABLE at the final stage of circuit 1, thereby allowing maximum flexibility and tight control of the RAM write enable pulse RAM_WE. Logic circuit 50 may be an AND gate or a NAND gate depending on whether RAM write enable pulse RAM_WE is active high or active low.

Pulse generator 100 includes an edge-triggered toggle flip-flop (T flip-flop) 10. T flip-flop 10 receives a clock signal CLK at an input terminal 12 and generates an output signal DIV2 at an output terminal 14 in response to the clock signal CLK. T flip-flop responds to the rising edge of the clock signal CLK, thereby producing an output signal DIV2 that is decoupled from the falling edge of the clock signal CLK. Thus, output signal DIV2 is independent of the duty cycle of the clock signal CLK. Other circuits may be used to generate an output signal that is decoupled from the duty cycle of the input clock signal.

Clock signal CLK may be generated internally or externally to the ASIC device and is often generated by a phase lock loop (PLL) circuit. PLL circuits and the clock distribution network which typically accompanies the PLL circuits and distributes the PLL output clock signal throughout the ASIC device, typically do not have tight control of the falling edge of the clock signal. This is because the gate/transistor delays in the circuit and the network vary for rising and falling edges of the clock signal. Thus, if the width of the RAM write enable pulse is dependent on the falling edge of the clock signal, the width of the RAM write enable pulse is also difficult to control. By removing the dependency of the output signal from the input clock duty cycle, the variation in the falling edge of the clock signal does not affect the control of the RAM write enable pulse. It follows that the clock signal may be generated by PLL circuits or other types of circuits without the disadvantage mentioned above.

Because the output signal DIV2 is independent from the input clock duty cycle, the duty cycle of the input clock signal may vary significantly. For example, the clock signal duty cycle may be 70/30, meaning 70% of the clock signal for one cycle is in a logic high state and the remaining 30% of the signal of the cycle is in a logic low state. The frequency of the clock signal may also be adjusted in accordance with the ASIC usage requirement. The typical frequency of the clock signal for a system level IC may be 150–200 MHz. However, the clock frequency does not need to remain constant.

In general, output signal DIV2 may be of any frequency so long as it tracks the rising edge of the clock signal CLK. In one embodiment, output signal DIV2 has a frequency that is one half the frequency of clock signal CLK. In other words, clock signal CLK toggles T flip-flop 10, generating alternating logic high and logic low pulses at one-half the frequency of input clock signal CLK.

Output terminal 14 of T flip-flop 10 is coupled to an input terminal 21 of a delay circuit 20. Delay circuit 20 determines the rising edge of the RAM write enable signal RAM_WE and generates a delay signal DELAY1 in response to output signal DIV2 at an output terminal 29. Delay circuit 20 may include any combination of inverting and/or noninverting elements that is capable of producing the predetermined setup delay for the address and data signals with respect to the desired RAM write enable pulse. For example, delay circuit 20 may include noninverting delay elements 22 and 26 and inverting delay element 24 coupled in series. The delay elements may be special delay cells in the ASIC library or any conventional delay elements. THe combination of inverting and noninverting elements provides better control and balance of the delay of the rising and falling edges of the pulse.

Setup delay is the time period during which the address needs to remain steady (i.e., at a constant state) before the write enable pulse is triggered. For an active high write enable pulse, for example, the rising edge indicates the start of a write cycle to a particular memory cell at a particular address. Once the RAM initiates the write process, the address signal indicating the address of the memory cell to be written into must remain constant. To ensure adequate setup delay, process variables and the size of the RAM (which typically contribute a 20–30% variation in the timing requirement) need to be taken into consideration. The setup delay requirement is typically specified by the ASIC manufacturer and is specific to the ASIC. For a compiled RAM in a 0.35 μm process, for example, the setup delay is approximately 1.309 ns.

Output terminal 29 of delay circuit 20 is coupled to an input terminal 31 of a delay circuit 30. Delay circuit 30 generates a delay signal DELAY2 in response to delay signal DELAY1 at an output terminal 39. Delay signal DELAY2 determines the falling edge of the RAM write enable pulse RAM_WE, as well as the hold time of the address and data signals with respect to the RAM write enable pulse RAM_WE. Hold delays are times during which the address signal indicating the address of the memory cell (or data signals indicating the data) to be written into must remain steady after the RAM write enable pulse has ceased. Often times the hold delay is zero but can be non-zero depending on the ASIC RAM.

Delay circuit 30 may include a combination of inverting and/or noninverting delay elements necessary to generate a specified pulse and hold delays. For example, delay circuit 30 may include two noninverting delay elements 32 and 34 coupled in series.

Delay circuits 20 and 30 provide a way to independently adjust the rising and falling edges of the RAM write enable pulse. For example, delay circuit 20 controls the position of the rising edge of the RAM write enable pulse RAM_WE by adjusting the amount of delay with respect to the rising edge of the clock signal CLK. Similarly, delay circuit 30 controls the falling edge (or the duration) of the RAM write enable pulse RAM_WE by adjusting the amount of delay with respect to the rising of the RAM write enable pulse RAM_WE (or delay signal DELAY1).

Delay circuits 20 and 30 are coupled to input terminals 41 and 42, respectively, of a logic circuit 40 which generates a pulse signal PULSE at an output terminal 49 by combining delay signals DELAY1 and DELAY2. Logic circuit 40 is dependent on the polarities of delay signal DELAY1 and delay signal DELAY2. For example, logic circuit 40 may be an XOR element if delay signal DELAY2 is not inverted from delay signal DELAY1. In the alternative, logic circuit 40 may be an XNOR element if delay signal DELAY2 is inverted from delay signal DELAY1. Therefore, delay circuits 20 and 30 are not polarity sensitive because the type of logic circuit 40 is adjusted in accordance with the polarities in the delay circuits 20 and 30. Because the delay circuits 20 and 30 are not polarity sensitive, they are not limited by the type of delay elements and as discussed above, may use any combination of inverting and/or noninverting delay elements to best control and balance the delay of the rising and falling edges of the pulse.

Write enable signal generator 200 includes a D flip-flop 210 which registers an external write enable signal WE1 and a D flip-flop 220 which registers an external write enable signal WE2. External write enable signals WE1 and WE2 may be generated by other functional logic on the ASIC or from a source outside of the ASIC. D flip-flops 210 and 220 may be clocked by the same clock signal CLK that clocks the pulse generator 100. D flip-flops always track the input signal (e.g., external write enable signals WE1 and WE2) after the rising edge of the input clock signal.

D flip-flop 210 and D flip-flop 220 are coupled to input terminals 231 and 232, respectively, of a selector 230 which selects a registered external write enable signal (e.g., registered external write enable signal WE1_REG or WE2_REG) and generates a write enable signal ENABLE at an output terminal 239. Selector 230 may be a multiplexor and makes its selection based on a select signal SEL. Select signal SEL may be generated by other functional logic on the ASIC or from outside of the ASIC. Selector 230 allows selection of an external write enable signal to be used as the control for the RAM write operation from multiple external write enable signals, e.g., external write enable signals WE1 and WE2. A person of ordinary skill in the art will appreciate that selector 230 may include more than two input terminals for selecting from more than two external write enable signals.

Output terminal 49 of logic circuit 20 and output terminal 239 of selector 230 are coupled to input terminals 51 and 52, respectively, of logic circuit 50. It is noted that the increased number of external write enable signals does not significantly impact the performance of circuit 1 because the pulse signal PULSE and the write enable signal ENABLE are independently generated and then combined at the end stage of circuit 1. More specifically, if each external write enable signal requires its own pulse and is then combines with its own pulse, more logic circuits are needed. As a result, the number of variations and the potential for violating the setup, hold, and pulse width requirements are greater. It is well understood that to run at an optimum speed, it is generally desirable to have as few logic circuits as possible. By reducing the overhead to essentially logic gate 50, the performance of the RAM element is not significantly impacted by the number of the external write enable signals or where the external write enable signals are generated. This allows support of different methods of controlling the RAM element without altering the timing or the performance of the RAM.

All circuit elements described above may be found in a typical ASIC library. Therefore, no special transistor level designs are needed. In addition, the placement, layout, and verification of the circuit can be done with typical ASIC tools and process flows, as is known to those skilled in the art, thereby saving development cost.

Figure 2:
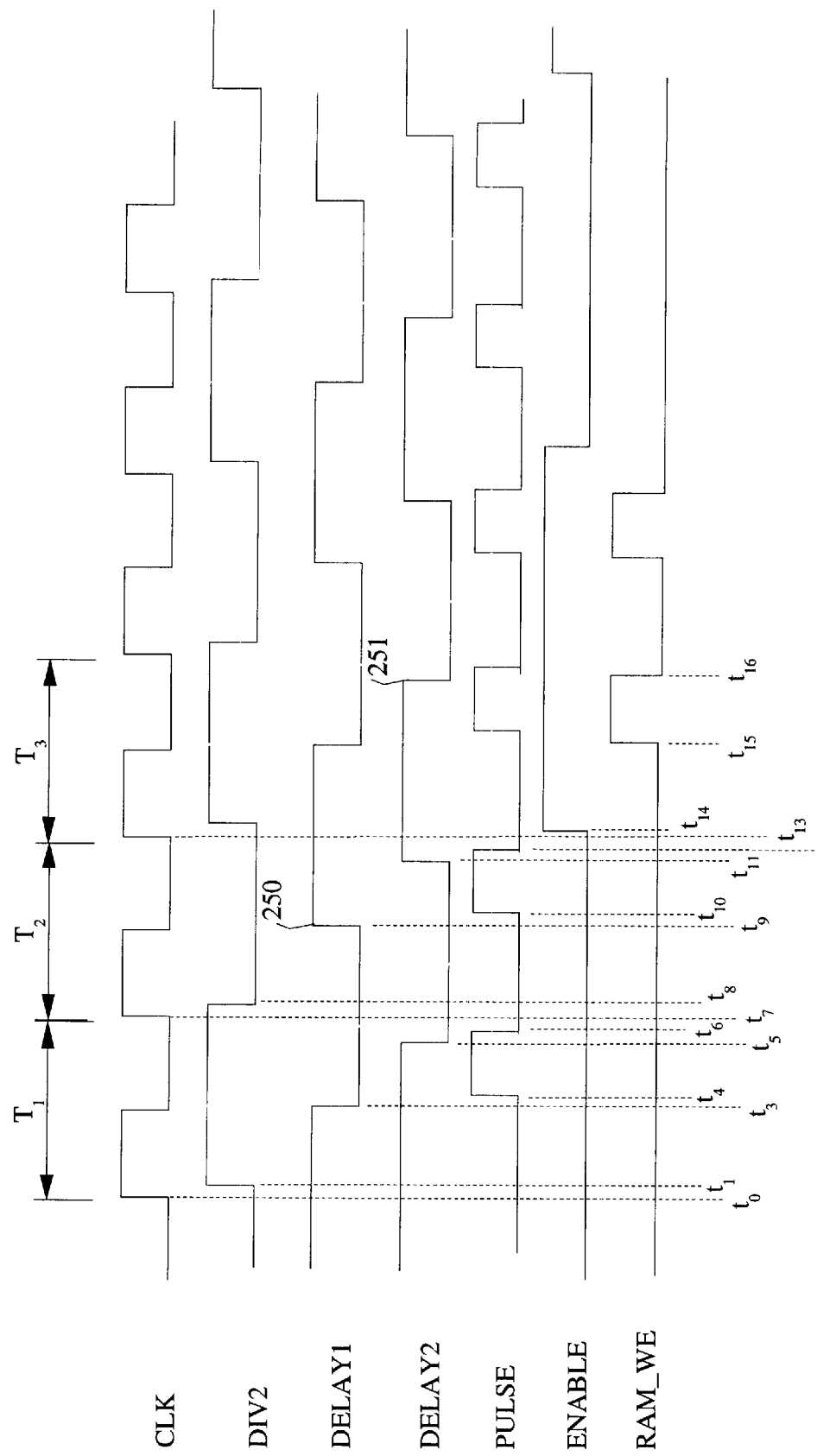
FIG. 2 shows a timing diagram for the circuit shown in FIG. 1.

FIG. 2 illustrates a timing diagram of various signals of circuit 1 of FIG. 1. Timing diagram depicted in FIG. 2 is not drawn to scale and does not represent relative voltage levels of the various signals. The various elements in circuit 1 are clocked by an input clock signal CLK. At the rising edge of the first clock pulse $T_1$ (i.e., at time $t_0$), output signal DIV2 is triggered to go to a logic high state after a time delay, at time $t_1$. The time delay is the time delay of T flip-flop 10. At the rising edge of the next clock pulse $T_2$ (i.e., at time $t_7$), output signal DIV2 goes to a logic low state after a time delay, at time $t_8$. In this embodiment, output signal DIV2 is at approximately one-half frequency of the input clock signal CLK which has a duty cycle of approximately 50%.

Output signal DIV2 propagates through delay circuit 20 and produces a delay signal DELAY1 which lags behind output signal DIV2 by a time delay produced by delay circuit 20. For example, delay signal DELAY1 goes to a logic low state at time $t_3$ and goes to a logic high state at time $t_9$.

Delay signal DELAY1 propagates through delay circuit 30 which outputs a delay signal DELAY2. Hence, delay signal DELAY2 lags behind delay signal DELAY1 by a time delay produced by delay circuit 30. For example, delay signal DELAY2 goes to a logic low state at time $t_5$ and goes to a logic high state at time $t_{11}$.

Logic circuit 40 combines delay signals DELAY1 and DELAY2, producing a pulse signal PULSE, for example, between time $t_4$ and time $t_6$ and between time $t_{10}$ and time $t_{12}$. It is noted that delay signal DELAY1 produced by delay circuit 20 determines the rising edge of the pulse signal PULSE (e.g., rising edge 250 of delay signal DELAY1) and delay signal DELAY2 produced by delay circuit 30 determines the falling edge (or the duration) of the pulse signal PULSE (e.g., falling edge 251 of delay signal DELAY2).

At time $t_{13}$, the clock signal CLK starts a third cycle $T_3$. The write enable signal ENABLE goes to a logic high state at time $t_{14}$ after a time delay caused by D flip-flop 210 (or D flip-flop 220) and selector 230. Logic circuit 50 performs an AND logic function on pulse signal PULSE and write enable signal ENABLE to produce a RAM write enable pulse RAM_WE. For example, when write enable signal ENABLE is high and the pulse signal PULSE is also high, RAM write enable pulse RAM_WE is at a logic high state after a time delay, at time $t_{15}$. Similarly, when write enable signal ENABLE is high and the pulse signal PULSE is low, RAM write enable pulse RAM_WE is at a logic low state after a time delay, at time $t_{16}$. It is noted that the RAM write enable pulse RAM_WE is derived from the rising edge of the input clock signal CLK only and no falling edge of the input clock signal CLK is used.

Figure 3:
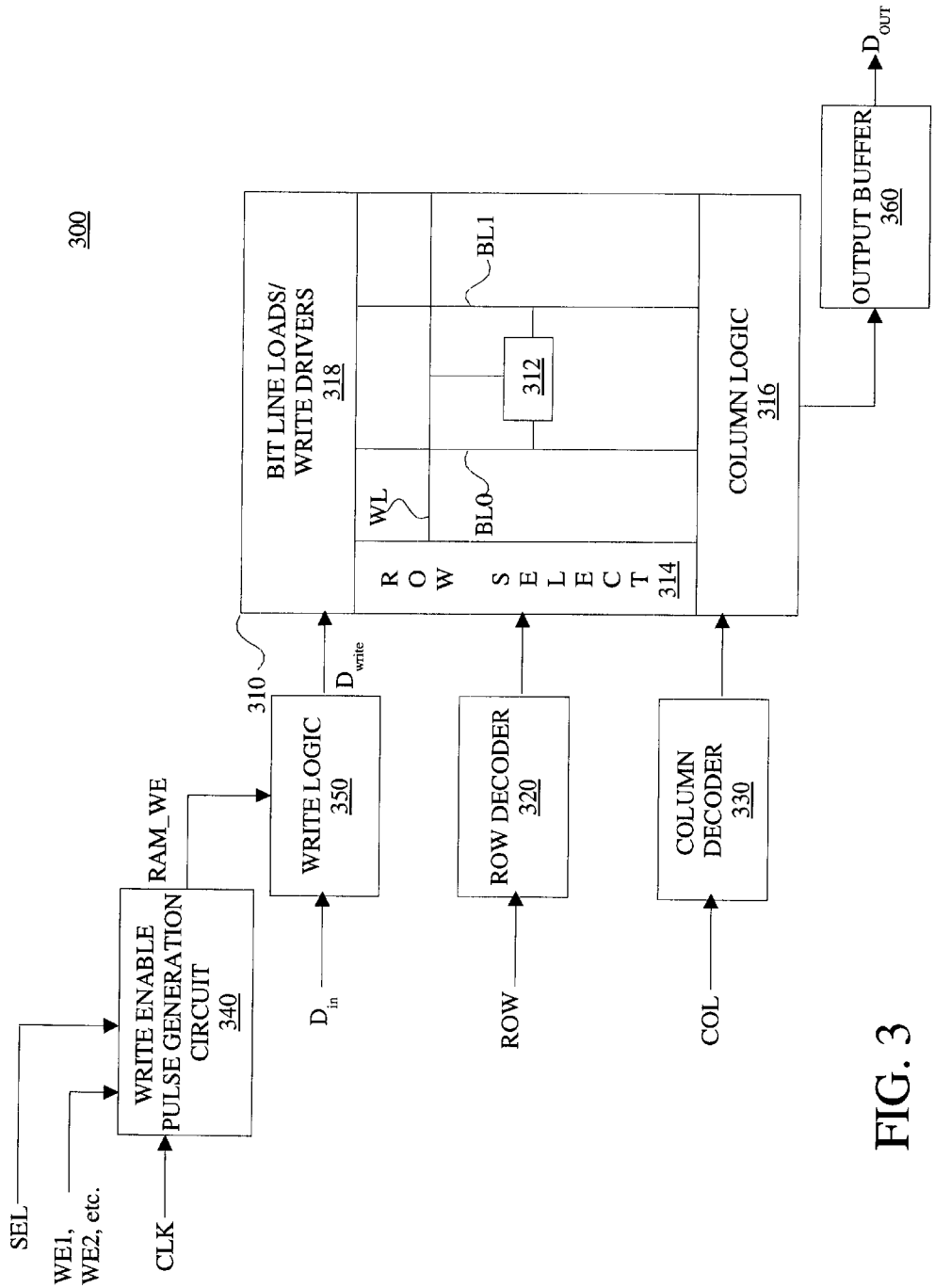
FIG. 3 shows in block diagram form a memory in accordance with the present invention.

The write enable pulse generation circuit shown in FIG. 1 may be implemented in a memory device 300 shown in FIG. 3. Memory device 300 includes a memory array 310 which includes an array of static or dynamic random access memory cells. Each memory cell is coupled to a bit line pair BL0 and BL1 and to a word line WL. For ease of understanding, only an exemplary memory cell 312 is shown coupled to a bit line pair BL0 and BL1 and to a word line WL.

A row decoder 320 receives a plurality of address signals ROW and a column decoder 330 receives a plurality of address signals COL. Row decoder 320 and column decoder 330 each provides a plurality of decoded address signals to row select 314 and column logic 316, respectively. In response to the received decoded address signals, row select 314 selects a word line in memory array 310, and column logic 316 selects a bit line pair. A memory cell (e.g., memory cell 312) located at the intersection of the word line (e.g., WL) and the bit line pair (e.g., bit lines BL0 and BL1) receives data via the bit line pair during a write cycle, or provides data to the bit line pair during a read cycle, as explained below.

During a read cycle of memory device 300, an external write enable signal (e.g., WE1 or WE2) and a select signal SEL are each asserted as a logic high signal and provided to write enable pulse generation circuit 340 which is similar to circuit 1 described above. Write enable pulse generation circuit 340 provides a write enable pulse RAM_WE to write logic 350 in response to a selected write enable signal WE1 or WE2. Row address signals ROW are provided to row decoder 320 and column address signals COL are provided to column decoder 330 to select a memory cell (e.g., memory cell 312) to be read. Data is provided by memory cell 312 to bit line pair BL0/BL1 in the form of a differential voltage between the bit lines. Sense amplifiers (not shown) in column logic 316 senses and amplifies the differential voltage and provides the differential voltage to output buffer 360. Data signals $D_{out}$ are provided to output terminals (not shown) that correspond to data stored in the selected memory cell 312.

During a write cycle of memory device 300, write enable signal WE1 or WE2 is asserted as a logic low, and select signal SEL is asserted as a logic high. Row address signals ROW are provided to row decoder 320 and column address signals COL are provided to column decoder 330 to select a memory cell to be written to, e.g., memory cell 312. Data signals $D_{in}$ are provided to write logic 350 which includes data buffer and latches. Write enable pulse RAM_WE is asserted as a logic high on a rising edge of input clock signal CLK by write enable pulse generation circuit 340. During the time that write pulse RAM_WE is a logic high, differential data signal $D_{write}$ are provided to bit line lads/write drivers 318. A selected bit line pair, e.g., bit line pair BL0/BL1, receives the differential data signals $D_{write}$ in the form of a differential voltage, and provides the differential voltage to the selected memory cell. The differential voltage provided to the bit line pair is typically large enough to overwrite the data stored in the selected memory cell.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the spirit and scope of the invention.

We claim:

1. A circuit for generating a write enable pulse, comprising:
    a pulse generator for generating a pulse, the pulse tracking a leading edge of a clock signal;
    a write enable signal generator for generating a write enable signal; and
    a first logic circuit coupled to the pulse generator and the write enable signal generator for generating the write enable pulse by combining the pulse and the write enable signal, the first logic circuit performing a logic operation in accordance with a polarity of the write enable pulse.

2. The circuit of claim 1, wherein the pulse generator comprises:
    a device for generating an output signal in response to the clock signal;
    a first delay circuit for generating a first delay signal in response to the output signal;
    a second delay circuit coupled to the first delay circuit, the second delay circuit generating a second delay signal in response to the first delay signal; and
    a second logic circuit coupled to the first delay circuit and the second delay circuit, the second logic circuit generating the pulse by combining the first delay signal and the second delay signal.

3. The circuit of claim 2, wherein the device comprises a toggle flip-flop.

4. The circuit of claim 2, wherein the first delay circuit includes at least one delay element.

5. The circuit of claim 2, wherein the first delay circuit includes a plurality of delay elements, the delay elements are selected from the group consisting of inverting delay elements and noninverting delay elements.

6. The circuit of claim 2, wherein the second delay circuit includes at least one delay element.

7. The circuit of claim 2, wherein the second delay circuit includes a plurality of delay elements, the delay elements are selected from the group consisting of inverting delay elements and noninverting delay elements.

8. A circuit for generating a write enable pulse, comprising:
    a pulse generator for generating a pulse, the pulse tracking a leading edge of a clock signal;

a write enable signal generator for generating a write enable signal, wherein the write enable signal generator comprises a register for registering an external write enable signal, the register being clocked by the clock signal; and a first logic circuit coupled to the pulse generator and the write enable signal generator for generating the write enable pulse by combining the pulse and the write enable signal.

9. The circuit of claim 8, wherein the register comprises a delay flip-flop.

10. A circuit for generating a write enable pulse, comprising:

a pulse generator for generating a pulse, the pulse tracking a leading edge of a clock signal;

a write enable signal generator for generating a write enable signal, wherein the write enable signal generator comprises a plurality of registers for registering a plurality of external write enable signals and a selector for selecting a registered external write enable signal; and a first logic circuit coupled to the pulse generator and the write enable signal generator for generating the write enable pulse by combining the pulse and the write enable signal.

11. A method for generating a write enable pulse, comprising:

generating a pulse in response to a clock signal, the pulse tracking the leading edge of the clock signal;

generating a write enable signal;

determining a logic function in accordance with a polarity of the write enable pulse; and generating the write enable pulse by performing the logic function on the pulse and the write enable signal.

12. A method for generating a write enable pulse, comprising:

generating a pulse in response to a clock signal, the pulse tracking the leading edge of the clock signal, wherein generating the pulse comprises, generating an output signal in response to the clock signal;

delaying the output signal to generate a first delay signal;

delaying the first delay signal to generate a second delay signal; and performing a first logic function on the first delay signal and the second delay signal, thereby generating the pulse;

generating a write enable signal;

generating the write enable pulse by combining the pulse and the write enable signal.

13. The method of claim 12, further comprising arranging at least one delay elements in accordance with a predetermined setup time and a predetermined hold time, the at least one delay elements being selected from the group consisting of inverting delay elements and noninverting delay elements.

14. The method of claim 12, further comprising determining the first logic function in accordance with a first polarity of the first delay signal and a second polarity of the second delay signal.

15. A method for generating a write enable pulse, comprising:

generating a pulse in response to a clock signal, the pulse tracking the leading edge of the clock signal;

generating a write enable signal, wherein generating a write enable signal comprises registering at least one external write enable signal;

generating the write enable pulse by combining the pulse and the write enable signal.

16. The method of claim 15, wherein a plurality of external write enable signals are registered, further comprising:

selecting a registered external write enable signal; and generating the write enable signal from a selected registered external write enable signal.

17. The method of claim 11, wherein the polarity is either active high or active low.

18. A memory circuit, comprising:

a plurality of memory cells, each of the plurality of memory cells being coupled to a bit line and a word line;

a write logic circuit coupled to the plurality of memory cells, the write logic circuit providing a data signal to the bit line in response to a write enable pulse, the data signal corresponding to input data; and a write enable pulse generator coupled to the write logic circuit, the write enable pulse generator comprising:

a pulse generator for generating a pulse in response to a clock signal, the pulse tracking a leading edge of the clock signal;

a write enable signal generator for generating the write enable signal, wherein the write enable signal generator comprises at least one register for registering an external write enable signal; and a logic circuit coupled to the pulse generator and the write enable signal generator for generating a write enable pulse by combining the pulse and the write enable signal.

19. A circuit for generating a write enable pulse, comprising:

a pulse generator for generating a pulse, the pulse tracking a leading edge of a clock signal, wherein the pulse generator comprises:

a device for generating an output signal in response to the clock signal;

a first delay circuit for generating a first delay signal in response to the output signal;

a second delay circuit coupled to the first delay circuit, the second delay circuit generating a second delay signal in response to the first delay signal, the second delay signal does not feed into the second delay circuit; and a first logic circuit coupled to the first delay circuit and the second delay circuit, the first logic circuit generating the pulse by combining the first delay signal and the second delay signal;

a write enable signal generator for generating a write enable signal; and a first logic circuit coupled to the pulse generator and the write enable signal generator for generating the write enable pulse by combining the pulse and the write enable signal.

20. An apparatus for generating a write pulse signal, comprising:

a pulse generator for generating a pulse, comprising:

a first flip-flop;
a first delay circuit coupled to the first flip-flop;
a second delay circuit coupled to the first delay circuit; and
a first logic circuit coupled to the first delay circuit and the second delay circuit to generate the pulse;
a write enable signal generator for generating a write enable signal, comprising:
at least one register for registering at least one external enable signal; and
a selector for selecting from the at least one registered external enable signal to generate the write enable signal; and
a second logic circuit coupled to the pulse generator and the write enable signal generator for generating the write enable pulse by combining the pulse and the write enable signal.

* * * * *